(12) United States Patent
Nakamura et al.

(10) Patent No.: US 9,820,379 B2
(45) Date of Patent: Nov. 14, 2017

(54) CIRCUIT BOARD AND ELECTRONIC DEVICE INCLUDING SAME

(75) Inventors: Kiyotaka Nakamura, Kirishima (JP);
Yoshio Ohashi, Satsumasendai (JP);
Yuuichi Abe, Satsumasendai (JP);
Eisuke Hirano, Satsumasendai (JP);
Kunihide Shikata, Kirishima (JP);
Keiichi Sekiguchi, Satsumasendai (JP)

(73) Assignee: Kyocera Corporation, Kyoto-shi, Kyoto (JP)

(*) Notice: Subject to any disclaimer, the term of this patent is extended or adjusted under 35 U.S.C. 154(b) by 569 days.

(21) Appl. No.: 14/124,227

(22) PCT Filed: May 30, 2012

(86) PCT No.: PCT/JP2012/063946
§ 371 (c)(1),
(2), (4) Date: Mar. 21, 2014

(87) PCT Pub. No.: WO2012/169408
PCT Pub. Date: Dec. 13, 2012

(65) Prior Publication Data
US 2014/0268589 A1    Sep. 18, 2014

(30) Foreign Application Priority Data

Jun. 8, 2011  (JP) .................. 2011-128404

(51) Int. Cl.
*H05K 1/09* (2006.01)
*H01L 23/367* (2006.01)
(Continued)

(52) U.S. Cl.
CPC .............. *H05K 1/09* (2013.01); *H01L 23/15* (2013.01); *H01L 23/3677* (2013.01);
(Continued)

(58) Field of Classification Search
CPC ...... H05K 3/284; H05K 3/281; H05K 7/1417; H01L 2924/01079; H01L 2924/00013;
(Continued)

(56) References Cited

U.S. PATENT DOCUMENTS 8,617,982 B2 * 12/2013 Danek ............... H01L 21/28562
257/774
2005/0023702 A1 * 2/2005 Nishimura ........ H01L 21/28556
257/774

(Continued)

FOREIGN PATENT DOCUMENTS

CN  101752299 A  6/2010
JP  05259529 A  10/1993

(Continued)

OTHER PUBLICATIONS

Search Report issued for European application No. 12797274.3 dated Apr. 29, 2015.

(Continued)

*Primary Examiner* — Nathan Milakovich
(74) *Attorney, Agent, or Firm* — Viering, Jentschura & Partner mbB (57) ABSTRACT

A circuit board and an electronic device having the circuit board that includes a ceramic sintered body, a through conductor and a metal wiring layer. The ceramic sintered body includes a through hole penetrating from a first main surface to a second main surface thereof. The through conductor is in the through hole and has first and second ends. The metal wiring layer covering the first end and electrically connected to the through conductor. The through conductor includes: a first portion having a hollow cylinder shape, in contact with an inner wall of the through hole and extending from the first end to the second end; and a second portion having a columnar shape and disposed inside the (Continued)

first portion. The second portion has an average grain size of the metal larger than that in the first portion.

18 Claims, 3 Drawing Sheets

(51) Int. Cl.
| | | |
|---|---|---|
| | *H01L 23/498* | (2006.01) |
| | *H01L 23/15* | (2006.01) |
| | *H05K 1/02* | (2006.01) |
| | *H05K 1/03* | (2006.01) |
| | *H05K 1/11* | (2006.01) |
| | *H05K 3/40* | (2006.01) |

(52) U.S. Cl.
CPC ..... *H01L 23/49827* (2013.01); *H05K 1/0206* (2013.01); *H05K 1/0306* (2013.01); *H05K 1/115* (2013.01); *H01L 2224/32225* (2013.01); *H01L 2224/48091* (2013.01); *H01L 2224/48227* (2013.01); *H01L 2224/73265* (2013.01); *H01L 2924/12032* (2013.01); *H01L 2924/1305* (2013.01); *H01L 2924/13055* (2013.01); *H01L 2924/13091* (2013.01); *H05K 3/4061* (2013.01); *H05K 2201/0266* (2013.01); *H05K 2201/0326* (2013.01); *H05K 2203/049* (2013.01)

(58) Field of Classification Search
CPC ............ H01L 2924/00; H01L 2924/14; H01L 21/76898; H01L 2224/05552; H01L 2924/0002; H01L 2924/00014; H01L 2224/05099; H01L 2224/05599; H01L 2224/13099; H01L 2224/13599; H01L 2224/29099; H01L 2224/29599; H01L 23/481; H01L 23/485

USPC ................... 361/748, 750–751, 757, 760
See application file for complete search history.

(56) References Cited

U.S. PATENT DOCUMENTS

| | | | |
|---|---|---|---|
| 2009/0280643 A1* | 11/2009 | Andry | ............... H01L 21/76898 438/656 |
| 2010/0103634 A1* | 4/2010 | Funaya | ............... H01L 23/5389 361/761 |
| 2012/0162319 A1* | 6/2012 | Hayashi | ................ C04B 35/495 347/70 |
| 2013/0313675 A1* | 11/2013 | Nakano | ................... G01F 1/692 257/467 |

FOREIGN PATENT DOCUMENTS

| | | |
|---|---|---|
| JP | 09-046013 | 2/1997 |
| JP | 2002064263 A | 2/2002 |
| JP | 2002260444 A | 9/2002 |
| JP | 2003-110241 | 4/2003 |
| JP | 2004055593 A | 2/2004 |
| JP | 2004-134467 | 4/2004 |
| JP | 2004140005 A | 5/2004 |
| JP | 2007273648 A | 10/2007 |
| JP | 2009-54773 | 3/2009 |
| WO | 2005/027606 | 3/2005 |

OTHER PUBLICATIONS

English Translation of International Search Report issued in PCT/JP2012/063946 dated Aug. 1, 2012.

* cited by examiner

CIRCUIT BOARD AND ELECTRONIC DEVICE INCLUDING SAME

TECHNICAL FIELD OF THE INVENTION

The present invention relates to a circuit board and an electronic device including an electronic component mounted on the circuit board.

BACKGROUND ART OF THE INVENTION

Electronic devices are used in which electronic components such as a semiconductor element, a heat element, and a Peltier element are mounted on a circuit board with a metal wiring layer or the like bonded onto the circuit board therebetween. These electronic components generate heat when operating, and the amount of heat applied per unit volume of the circuit board is being increased as a response to recent demands for high integration of electronic components and size or thickness reduction of electronic devices. Accordingly, it is desired not only that the bonded members of the circuit board do not separate, but also that the circuit board exhibit high heat radiation.

Accordingly, through holes are formed in the support substrate of the circuit board, under the electronic components, and conductors (hereinafter referred to as through conductors) are formed in the through holes to increase heat radiation. However, if the through conductors are each formed by filling a through hole with a metal by plating, the metal grows from the inner wall of the through hole and finally forms a depression at the center of the surface of the through conductor. If the through hole is filled with a metal paste, a depression is formed at the center of the surface of the through conductor by shrinkage caused by firing. Also, the metal wiring layer covering the surface of the through conductor has a surface having similar characteristics to the surface of the through conductor. Accordingly, a depression is also formed in the metal wiring layer. This causes connection failure between the members when an electronic component is mounted on the metal wiring layer with an electrode pad therebetween, or heat radiation is reduced because the bonding area is reduced.

In order to solve such a disadvantage, the following PTL 1 proposes a non-shrinkable through-hole-filling conductive paste that will be fired after filling the through holes. The non-shrinkable conductive paste contains a conductive powder mainly containing a metal powder, an expanding agent, and a vehicle.

THE FOLLOWING IS A LIST OF THE AFOREMENTIONED BACKGROUND ART

PTL 1: Japanese Unexamined Patent Application Publication No. 9-46013

A circuit board produced using the non-shrinkable through-hole-filling conductive paste disclosed in Japanese Unexamined Patent Application Publication No. 9-46013 has been improved in terms of shrinkage caused when the through conductor is fired. However, the heat radiation of the resulting circuit board is not satisfactory because the thermal conductivity of the expanding agent is low.

The present invention provides a circuit board and an electronic device including an electronic component mounted on the circuit board. The circuit board has high bonding strength and exhibits good heat radiation, and is, in addition, so reliable that it can be used over a long time. Such a circuit board is provided by reducing depression size in the metal wiring layer on the through conductor.

SUMMARY OF THE INVENTION

The circuit board of the present invention includes a through conductor composed of a metal in a through hole passing through a ceramic sintered body in the thickness direction of the ceramic sintered body, and a metal wiring layer covering and connected to the surface of the through conductor at least at one of the main surfaces of the ceramic sintered body. The through conductor includes a first portion near the inner wall of the through hole, extending in the thickness direction of the ceramic sintered body from one end of the through hole to the other end, and a second portion adjacent to the first portion, and the second portion has a larger average crystal grain size than the first portion.

Also, the electronic device of the present invention includes an electronic component mounted on the metal wiring layer of the circuit board of the present invention having the above-described structure.

Advantageous Effects of Invention

In the circuit board of the present invention, metal grains are distributed in such a manner that large crystal grains are present near the center of the diameter of the through hole. Thus, the shrinkage of the metal paste caused by firing is reduced near the center of the diameter of the through hole. Consequently, the size of the depression in the through conductor is reduced. Also, since the second portion having a larger average crystal grain size is located near the center of the diameter of the through hole, heat that has been generated by the operation of the electronic component and has been conducted to one end of the through hole can be rapidly conducted to the other end, and thus the ability of heat radiation is enhanced. In addition, since the first portion having a smaller average crystal grain size is located near the inner wall of the through hole and extends in the thickness direction of the ceramic sintered body from one end of the through hole to the other end, the bonding strength of the through conductor can be enhanced.

The electronic device of the present invention includes an electronic component mounted on the metal wiring layer of the circuit board of the present invention, and is accordingly reliable.

BRIEF DESCRIPTION OF THE DRAWINGS

FIG. 2 illustrates the circuit board of the electronic device shown in FIG. 1: (a) is a plan view; and (b) is a sectional view taken along line A-A' in (a).

FIG. 3 illustrates a circuit board of another embodiment of the invention: (a) is a plan view; and (b) is a sectional view taken along line B-B' in (a).

DETAILED DESCRIPTION OF THE DRAWINGS

An embodiment of the invention will now be described with reference to the drawings.

Figure 1:
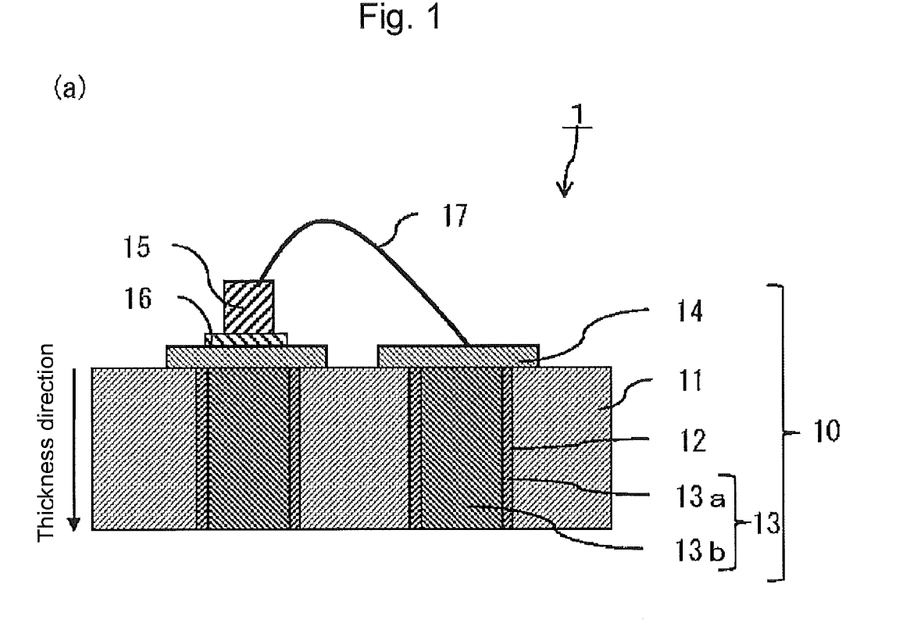
FIG. 1 is a sectional view of an electronic device including a circuit board of an embodiment of the invention.

FIG. 1 is a sectional view of an electronic device including a circuit board of the present embodiment. The electronic device 1 of the present embodiment includes a circuit board 10 including, through conductors 13 composed of a metal in through holes 12 passing through a ceramic sintered body 11 in its thickness direction, and metal wiring layers 14 covering and connected to the surfaces of the through conductors 13 at one main surface of the ceramic sintered body 11. For example, an electrode pad 16 is formed on any of the metal wiring layers 14 of the circuit board 10, and an electronic component 15 is mounted on the electrode pad 16. The electronic component 15 is thus electrically connected with a bonding wire 17 to complete the electronic device 1 of the present embodiment.

Examples of the electronic component 15 include semiconductor devices, such as an insulated-gate bipolar transistor (IGBT) element, an intelligent power module (IPM) element, a metal oxide semiconductor field-effect transistor (MOSFET) element, a light emitting diode (LED) element, a freewheeling diode (FWD) element, a giant transistor (GTR) element, and a Schottky barrier diode (SBD); heater elements for sublimatic thermal printer heads or thermal inkjet printer heads; and a Peltier element.

Figure 2:
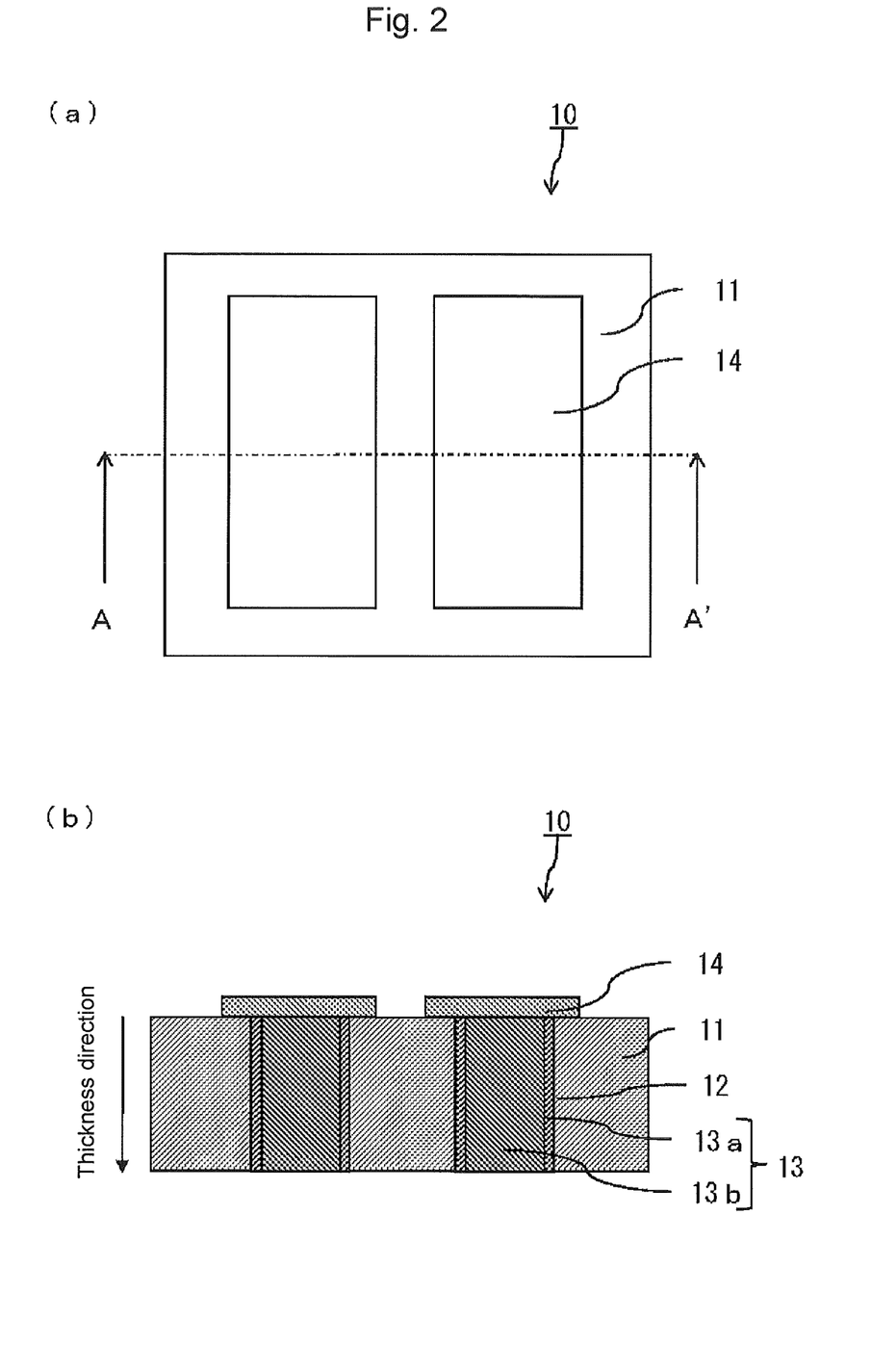

The circuit board 10 of the present embodiment will now be described with reference to the drawings. FIG. 2 illustrates the circuit board 10 of the electronic device shown in FIG. 1: (a) is a plan view; and (b) is a sectional view taken along line A-A' in (a). The same members in the figures to which the description below refers are designated by the same reference numerals as in FIG. 1.

As shown in FIG. 2, the circuit board 10 of the present embodiment includes through conductors 13 composed of a metal in through holes 12 passing through a ceramic sintered body 11 in its thickness direction, and metal wiring layers 14 covering and connected to the surfaces of the through conductors 13 at least at one of the main surfaces of the ceramic sintered body 11. Each through conductor 13 includes a first portion 13a located near the inner wall of the through hole 12, extending from one end of the through hole 12 to the other end in the thickness direction of the ceramic sintered body 11, and a second portion 13b adjacent to the first portion 13a. The average crystal grain size in the second portion 13b is larger than the average crystal grain size in the first portion 13a.

Since the second portion 13b having a larger average crystal grain size is located near the center of the diameter of the through hole 12, that is, metal grains having larger grain sizes are distributed near the center of the diameter of the through hole 12 in the through conductor 13 formed by firing a metal paste, the shrinkage of the metal paste caused by firing is small neat the center of the diameter of the through hole 12, and consequently, the size of the depression in the through conductor 13 can be reduced. Accordingly, the depression that will be formed in the metal wiring layer 14 covering and connected to the surface of the through conductor 13 can be reduced in size. Thus, problems can be reduced, such as the reduction of heat radiation due to a small contact area between an electrode pad on the metal wiring layer 14 and an electronic component (not shown), and function failure of the electronic device resulting from separation of the electrode pad. Also, since the second portion 13b having a larger average crystal grain size is located near the center of the diameter of the through hole 12, heat that has been generated by the operation of the electronic component (not shown) and has been conducted to one end of the through hole 12 can be rapidly conducted to the other end, and thus heat radiation is increased.

In addition, since the first portion 13a having a smaller average crystal grain size than the second portion 13b is located near the inner wall of the through hole 12, the bonding strength of the through conductor 13 in the through hole 12 is enhanced.

In the through conductor 13 of the circuit board 10 shown in FIG. 2, the second portion 13b is the portion, for example, corresponding to ⅘ of the radius of the through hole 12, in the direction from the center of the diameter to the inner wall of the through hole 12, in the sectional view shown in FIG. 2(b), and the first portion 13a is the portion other than the second portion 13b. For example, if the through hole 12 has a diameter of 130 μm (65 μm in radius), the second portion 13b is a portion defined by a circle having a radius of 52 μm from the center of the circle toward the inner wall of the through hole 12, and the first portion 13a is the other portion near the inner wall.

To confirm the presence of the first portion 13a and the second portion 13b, for example, the through conductor 13 is cut in the thickness direction of the ceramic sintered body 11, and the section of the through conductor 13 is polished with a cross-section polisher (CP) so that the section will have a diameter equal to the diameter of the through hole 12 in the ceramic sintered body 11, and is observed through an SEM (scanning electron microscope) at a magnification of 5000 times. Also, to measure the average crystal grain sizes of the first portion 13a and second portion 13b of the through conductor 13, for example, five points arbitrarily selected in each of the first portion 13a and the second portion 13b are observed, and the grain size is measured in each observation image using image analysis software. The average crystal grain sizes are thus simply calculated from the measurements of the crystal grain sizes.

The depression formed in the metal wiring layer 14 covering and connected to the surface of the through conductor 13 can be measured with a surface roughness meter or a laser displacement gauge. For example, in the measurement with a laser displacement gauge, the depression can be defined as the difference between the largest height and the smallest height of the measurements at several positions of the surface of the portion of the metal wiring layer 14 covering the surface of the through conductor 13 and of the surface of the portion of the metal wiring layer 14 not covering the surface of the through conductor 13.

In the circuit board 10 of the present embodiment, preferably, the second portion 13b contains 50% by area or more of grains having crystal grain sizes in the range of 4% to 10% of the smallest diameter of the through hole 12. The smallest diameter of the through hole 12 can be measured by observing the surface polished in the same manner as the polishing performed for the calculation of the average crystal grain size described above through an SEM at a magnification of 2000 times. When the second portion 13b contains 50% by area or more of grains having crystal grain sizes in the range of 4% to 10% of the smallest diameter of the through hole 12, depression size ire reduced, and, in addition, heat that has been generated by operation of the electronic component and conducted to one end of the through hole 12 can be rapidly conducted to the other end, and thus heat radiation is increased.

The area percentage in the second portion 13b of the grains having crystal grain sizes in the range of 4% to 10% of the smallest diameter of the through hole 12 can be determined by, for example, measuring observation images using image analysis software in the same manner as in the calculation of the average crystal grain size. Preferably, the second portion 13b has an average crystal grain size in the range of 3.1% to 5.8% of the smallest diameter of the through hole 12.

When the second portion 13b contains 50% by area or more of grains having crystal grain sizes in the range of 4% to 10% of the smallest diameter of the through hole 12, the second portion 13b of the through conductor 13 of the circuit board 10 of the present embodiment has 3% to 5% by area of voids having an average diameter in the range of 1% to 4% of the smallest diameter of the through hole 12. These voids in the second portion 13b contribute to the decrease in depression size in the through conductor 13 without reducing thermal conduction.

For measuring the average void diameter and the percentage of voids in the second portion 13b, for example, the voids are extracted by binarizing observation images with image analysis software in the same manner as in the measurement of the average crystal grain size.

In the circuit board 10 of the present embodiment, preferably, the first portion 13a has an average crystal grain size in the range of 1.5% to less than 4% of the smallest diameter of the through hole 12. When the average crystal grain size in the first portion 13a is in the range of 1.5% to less than 4% of the smallest diameter of the through hole 12, the bonding strength of the through conductor 13 in the through hole 12 can be enhanced. In addition, in the first portion 13a, also, heat that has been generated by operation of the electronic component and conducted to one end of the through hole 12 can be rapidly conducted to the other end.

In the circuit board 10 of the present embodiment, preferably, the average crystal grain size in the second portion 13b is larger than the average crystal grain size in the metal wiring layer 14. When the average crystal grain size in the second portion 13b is larger than the average crystal grain size in the metal wiring layer 14, heat generated by the operation of the electronic component 15 flows smoothly from the metal wiring layer 14 to the second portion 13b of the through conductor 13, and thus heat radiation is increased. For measuring the average crystal grain size of the metal wiring layer 14, first, the metal wiring layer 14 is cut in the thickness direction of the ceramic sintered body 11, and the section is polished with a cross-section polisher (CP). Then, the section is viewed through an SEM at a magnification of 5000 times, and five points are arbitrarily selected and observed. Each observation image is analyzed for crystal grain size using image analysis software. The average crystal grain size is calculated from the thus obtained crystal grain size values.

In the section cut in the thickness direction of the ceramic sintered body 11, the extension line from the surface of the ceramic sintered body 11, or a line defining the open end of the through hole 12, is the boundary between the through conductor 13 and the metal wiring layer 14.

Also, in the circuit board 10 of the present embodiment, the through conductor 13 contains glass, and the glass content in the second portion 13b is preferably higher than the glass content in the first portion 13a. When the glass content in the second portion 13b is higher than the glass content in the first portion 13a, the thermal expansion of the second portion 13b, which occupies a larger volume of the through conductor 13, is reduced. Consequently, the degree of change in the form of the through conductor 13 caused by heat cycles in which the electronic component 15 is repeatedly started and stopped is reduced, and accordingly, the through conductor 13 is unlikely to separate easily from the through hole 12.

For measuring the glass contents in the first portion 13a and the second portion 13b, for example, the through conductor 13 is cut in the thickness direction of the ceramic sintered body 11, and the section polished with a cross-section polisher (CP) is measured. Then, the boundary between the first portion 13a and the second portion 13b is viewed as described above. The first portion 13a and the second portion 13b are each viewed at a magnification of 2000 times using an EDS (energy distributed X-ray analyzer) attached to an SEM, and five arbitrarily selected points are observed. Each observation image is analyzed for glass content using image analysis software, and thus calculated average values can be defined as the glass contents of the first portion 13a and the second portion 13b.

In the circuit board 10 of the present embodiment, preferably, the through conductor 13 contains a glass containing Bi. When the through conductor 13 contains a glass containing Bi, the wettability to the ceramic sintered body 11 is enhanced, and accordingly, the bonding strength of the through conductor 13 in the through hole 12 is enhanced. This is because when the through conductor 13 in the through hole 12 has a high bonding strength, a large amount of Bi is present at the interface with the through hole 12. Examples of Bi-containing glass include, for example, $SiO_2$—$B_2O_3$—$Bi_2O_3$-based glass and $R_2O$—$SiO_2$—$B_2O_3$—$Bi_2O_3$-based glass (R: alkali metal). The presence of Bi can be observed, for example, using a TEM (transmission electron microscope) or an EDS attached to an SEM. The thickness of the glass is, for example, in the range of 0.5 μm to 5.0 μm.

Figure 3:
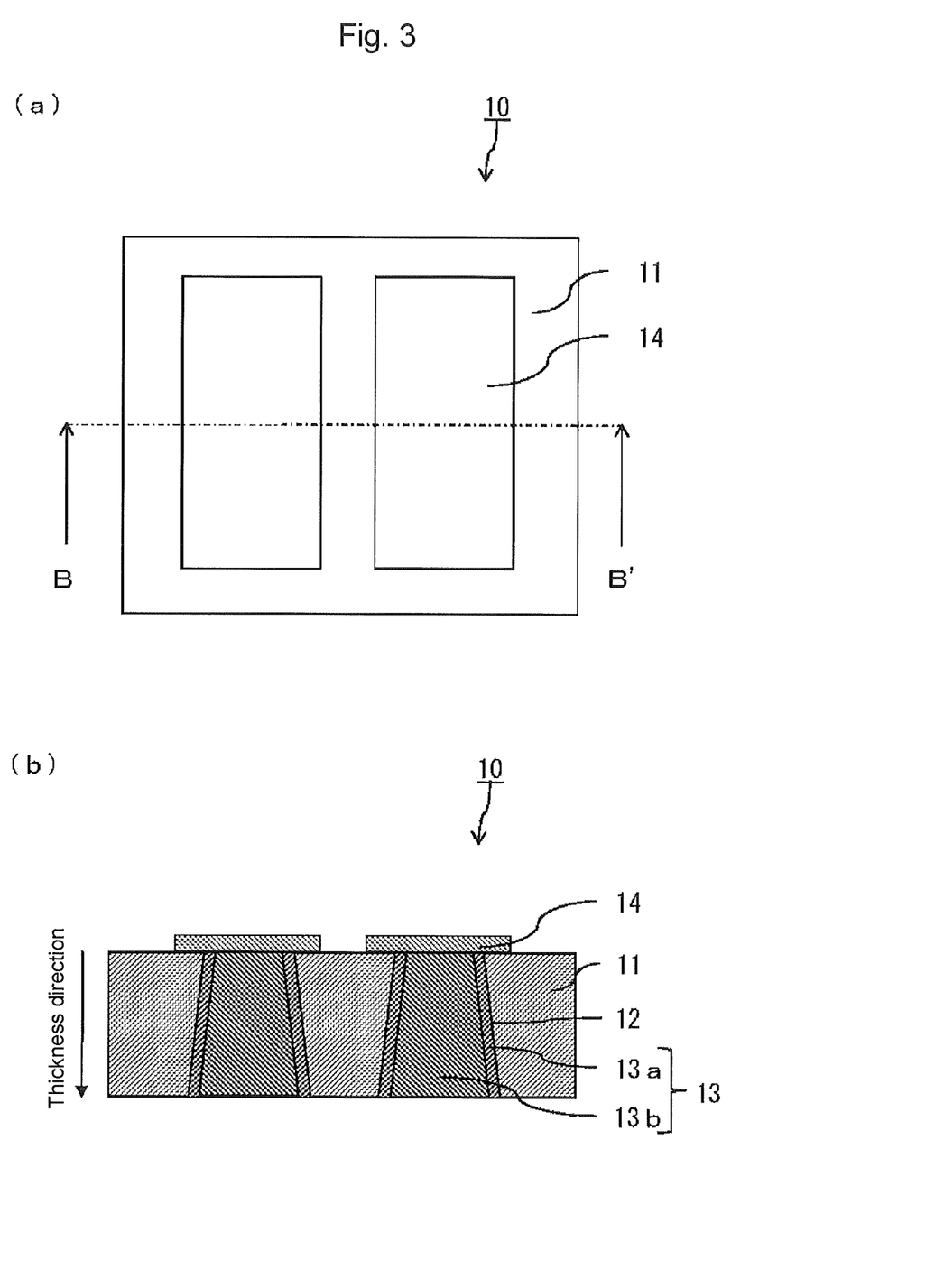

FIG. 3 illustrates a circuit board according to another embodiment of the present invention: (a) is a plan view; and (b) is a sectional view taken along line B-B' in (a).

In the circuit board 10 shown in FIG. 3, the open end of the through hole 12 at one of the main surfaces of the ceramic sintered body 11 has a larger area than the open end at the other (on which an electronic component will be mounted). When the open end of the through hole 12 at one main surface of the ceramic sintered body 11 has a larger area than the open end at the other main surface, heat that has been generated by the operation of an electronic component (not shown) and conducted to one end of the through hole 12 can be efficiently released from the other end, and thus heat radiation can be enhanced.

The ceramic sintered body 11 of the circuit board 10 of the present embodiment may be a sintered body of a ceramic selected from the group consisting of aluminum oxide-based, zirconium oxide-based, silicon nitride-based, aluminum nitride-based and mullite-based ceramics, or a sintered body of a mixture of these ceramics. If the through conductor 13 mainly contains copper, an aluminum oxide-based sintered body or an aluminum nitride-based sintered body may be used as the ceramic sintered body 11. In this instance, copper aluminate ($CuAl_2O_4$ or $CuAlO_2$) is formed at the interface between the inner wall of the through hole 12 and the through conductor 13 to increase the bonding strength between the through hole 12 and the through conductor 13. From the viewpoint of the workability of the formation of the through hole 12 or the like, the ceramic sintered body 11 is preferably composed of an aluminum oxide-based sintered body.

Preferably, the through conductor 13 of the circuit board 10 of the present embodiment mainly contains copper, silver or aluminum. Particularly preferably, the main constituent is copper. When the through conductor 13 mainly contains copper, the copper has a high thermal conductivity and can accordingly increase heat radiation. When the metal paste forming the through conductor 13 mainly contains copper, and further contains a glass having a softening point in the range of 600° C. to 700° C., the metal paste produces a high bonding strength by being fired at a temperature around the melting point of copper. The metal paste may contain at least one of zirconium, titanium, molybdenum, tin and zinc as an accessory constituent. The main constituent of the through conductor 13 is the constituent having a content of more than 50% by mass.

Preferably, the metal wiring layer 14 of the circuit board 10 of the present embodiment, as well as the through conductor 13, mainly contains copper, silver or aluminum, and particularly preferably copper. The exposed surface of the metal wiring layer 14 may be partially or entirely plated. Such plating facilitates the bonding of electrode pads or bonding wires, and, in addition, prevents the metal wiring layer 14 from oxidizing and corroding. Any known plating can be applied, such as gold, silver or nickel-gold plating.

A method for manufacturing the circuit board of the present embodiment will be described below.

First, an aluminum oxide-based sintered body is formed in a known process, using aluminum oxide ($Al_2O_3$) as a main constituent, and a powder of silicon oxide ($SiO_2$), magnesium oxide (MgO), calcium oxide (CaO) or the like as a sintering agent. Then, a through hole 12 is formed by use of a micro drill, sandblasting, microblasting, laser processing, or the like. For forming the through hole 12, laser processing is preferred because it does not leave many burrs or cracks, and can change the shape of the through hole 12 as required in the thickness direction of the ceramic sintered body 11 by adjusting the oscillation power.

Subsequently, a metal paste for forming the through conductor 13 is prepared. The metal paste contains a metal powder, a glass powder, and an organic vehicle. A metal oxide may be added if necessary. The metal powder may be a combination of, for example, a metal powder having an average crystal grain size of less than 1 µm, a metal powder having an average crystal grain size in the range of 1 µm to less than 3 µm, and a metal powder having an average crystal grain size in the range of 3 µm to less than 10 µm. In the use of such metal powders having different crystal grain sizes, the presence of the metal powder having an average crystal grain size as small as less than 1 µm increases the degree of sintering. In addition, the presence of the metal powder having an average crystal grain size as large as 3 µm to less than 10 µm increases thermal conductivity.

The metal paste for forming the first portion 13a contains a first metal powder. The first metal powder contains, for example, 40% to 65% by mass of a metal powder having an average crystal grain size of less than 1 µm, 20% to 45% by mass of a metal powder having an average crystal grain size in the range of 1 µm to less than 3 µm, and 10% to 35% by mass of a metal powder having an average crystal grain size in the range of 3 µm to less than 10 µm, relative to the total mass, 100% by mass, of the first metal powder.

The metal paste for forming the second portion 13b contains a second metal powder. The second metal powder contains, for example, 15% to 35% by mass of a metal powder having an average crystal grain size of less than 1 µm, 20% to 45% by mass of a metal powder having an average crystal grain size in the range of 1 µm to less than 3 µm, and 40% to 65% by mass of a metal powder having an average crystal grain size in the range of 3 µm to less than 10 µm, relative to the total mass, 100% by mass, of the second metal powder.

The glass powder is not particularly limited, and preferably has a softening point of 400° C. to 700° C. In particular, a glass powder having a softening point of 600° C. to 700° C. can hinder the grains of the metal powder from growing when the metal powder is sintered, thus reducing the crystal grain size. Consequently, the bonding strength of the through conductor 13 in the through hole 12 can be increased. Examples of the glass include $SiO_2$-based, $R_2O$—$SiO_2$-based (R: alkali metal element), $SiO_2$—$B_2O_3$-based, $R_2O$—$SiO_2$—$B_2O_3$-based, $SiO_2$—$B_2O_3$—$Bi_2O_3$-based, and $R_2O$—$SiO_2$—$B_2O_3$—$Bi_2O_3$-based glass. Among these, a Bi-containing glass is preferred in terms of increasing the bonding strength of the through conductor 13 with the inner wall of the through hole 12.

The organic vehicle is a solution of an organic binder in an organic solvent. The proportion of the organic solvent may be, for example, 2 to 6 relative to the organic binder. Examples of the organic binder include acrylic compounds, such as polybutyl methacrylate and polymethyl methacrylate; celluloses, such as cellulose nitrate, ethyl cellulose, cellulose acetate, and butyl cellulose; polyethers, such as polyoxymethylene; and polyvinyls, such as polybutadiene and polyisoprene. These organic binders may be used singly or in combination.

Examples of the organic solvent include Carbitol, Carbitol acetate, terpineol, metacresol, dimethylimidazole, dimethylimidazolidinone, dimethylformamide, diacetone alcohol, triethylene glycol, paraxylene, ethyl lactate, and isophorone. These organic solvents may be used singly or in combination.

As for the proportion of the metal powder, the glass powder and the organic vehicle contained in the metal paste, 100% by mass of the metal paste preferably contains 77.0% to 87.0% by mass of metal powder, 0.5% to 5% by mass of glass powder and 10% to 20% by mass of organic vehicle. For smoothly filling the through hole 12 with the metal paste, the viscosity of the metal paste is preferably in the range of 0.8 Pa·s to 1.3 Pa·s.

If a metal oxide is added to the metal powder, copper oxide (CuO or $Cu_2O$) is preferably used for the aluminum oxide-based or aluminum nitride-based ceramic sintered body 11. When the metal paste contains copper oxide as a metal oxide, copper aluminate ($CuAl_2O_4$ or $CuAlO_2$) is easily produced. Thus, the bonding strength of the through conductor 13 with the inner wall of the through hole 12 can be further enhanced.

When the ceramic sintered body 11 is composed of an aluminum oxide-based ceramic, aluminum oxide ($Al_2O_3$) can be used as the metal oxide in the metal paste to bring the thermal expansion coefficient of the through conductor 13 formed by firing the metal paste close to the thermal expansion coefficient of the aluminum oxide-based sintered body. Thus, problems, such as separation of bonded members, can be reduced which results from the difference in thermal expansion coefficient between the ceramic sintered body 11 and the through conductor 13.

Then, the first paste for forming the first portion 13a is prepared using the above-described first metal powder, glass powder, and organic vehicle, and the second metal paste for forming the second portion 13b is prepared using the above-described second metal powder, glass powder and organic vehicle. The first metal paste and the second metal paste are introduced around the inner wall of the through hole 12 and the center of the diameter of the through hole 12, respectively, using a nozzle that can simultaneously discharge the two metal pastes.

In this instance, by varying the glass powder contents in the first metal paste and the second metal paste, the glass contents in the first portion 13a and the second portion 13b can be controlled.

Then, the metal paste in the through hole 12 is dried at 80° C. to 150° C. Drying at a temperature in this range allows voids, which contribute to decrease in depression size, to be formed without evaporating a large amount of the organic solvent from the metal paste and degrading the ability of heat radiation. Subsequently, firing is performed for a period of time in the range of 0.5 to 3 hours at temperatures up to 850° C. to 1050° C. for the metal paste containing copper as the metal powder, at temperatures up to 800° C. to 1000° C. for the metal paste containing silver powder, and at temperatures up to 500° C. to 600° C. for the metal paste containing aluminum powder. This firing is performed in a non-oxidizing atmosphere to suppress the oxidation of the metal paste.

Subsequently, a metal wiring layer 14 is formed on the surface of the through conductor 13 at one main surface of the ceramic sintered body 11. While it is desirable to use a metal paste having good electrical and thermal conductivities for forming the metal wiring layer 14, the same metal paste as either of the metal pastes for forming the through conductor 13 is advantageous from the viewpoint of simplifying the manufacturing process, and reducing the difference in thermal expansion coefficient between the through conductor 13 and the metal wiring layer 14.

The metal wiring layer 14 can be formed by printing a metal paste by a known screen printing method, and then drying and firing the metal paste. Preferably, the metal wiring layer 14 has a thickness of 40 μm or more. The metal wiring layer 14 having a thickness of 40 μm or more can exhibit good heat radiation while maintaining electrical conductivity.

The metal wiring layer 14 may be formed by repeating the operations of printing, drying and firing several times until reaching a desired thickness. In addition, it will be appreciated that the metal wiring layer 14 may be formed on the surface of the through conductor 13 at the other main surface of the ceramic sintered body 11 to enhance the ability of heat radiation.

In the formation of the metal wiring layer 14, the metal paste is printed so that the metal wiring layer 14 spreads to a region where the metal wiring layer is not required, followed by drying and firing. Then, a resist layer is formed in the region where the metal wiring layer 14 is required, is then etched with an etchant containing ferric chloride, cupric chloride, or an alkali. The resist layer is then removed using an aqueous solution of sodium hydroxide or the like, and a metal wiring layer 14 is thus formed in a desired region. When the metal wiring layer 14 is formed by etching, the thickness of the metal wiring layer 14 is preferably 100 μm or less.

Through the above-described procedure, the circuit board 10 is manufactured which includes the through conductor 13 composed of a metal in the through hole 12 passing through the ceramic sintered body 11 in its thickness direction, and the metal wiring layer 14 covering and connected to the surface of the through conductor 13 at least at one main surface of the ceramic sintered body 11. In the circuit board 10, the through conductor 13 includes a first portion 13a near the inner wall of the through hole 12, extending from one end of the through hole 12 to the other end in the thickness direction of the ceramic sintered body 11, and a second portion 13b adjacent to the first portion 13a. The average crystal grain size in the second portion 13b is larger than the average crystal grain size in the first portion 13a.

However, the manufacture of the circuit board 10 of the present embodiment is not limited to the above-described method. The efficiency of the manufacture of the circuit board 10 can be increased by forming many circuit boards, by the above-described method, in a ceramic sintered body 11 provided with dividing grooves, and subsequently dividing the ceramic sintered body into many pieces.

Then, for example, an electrode pad 16 is formed on the metal wiring layer 14, and an electronic component 15 is mounted on the electrode pad 16 to complete an electronic device 1. The electronic device 1 of the present embodiment, which has a structure in which an electronic component 15 is mounted on the circuit board 10 of an embodiment, is so reliable that it can be used over a long time. In order to achieve an electronic device 1 superior in heat radiation, it is preferable that the electronic component 15 lie on the surface of the through conductor 13 at one main surface of the ceramic sintered body 11 with the metal wiring layer 14 or the like therebetween.

Examples of the present invention will be further described. However, the invention is not limited to the following Examples.

EXAMPLE 1

Samples each in which the average crystal grain sizes in the first portion 13a and second portion 13b were varied among samples were prepared, and were examined for the depression in the through conductor 13, heat radiation, and reliability.

First, an aluminum oxide-based sintered body containing 96% by mass of aluminum oxide and sintering agents of silicon oxide and magnesium oxide was prepared. In the ceramic sintered body 11, grooves were formed so that many samples could be obtained.

Then, the ceramic sintered body 11 was subjected to laser processing to form a through hole 12 of 130 μm in diameter from one end of the ceramic sintered body to the other end. Subsequently, metal pastes used for preparing the samples were prepared from copper. Each metal paste contained 86% by mass of a mixture of metal powders having different crystal grain sizes of 0.5 μm, 2 μm and 6 μm, which were mixed in such a proportion that the mixture would have an average crystal grain size shown in Table 2, 3% by mass of $R_2O$—$SiO_2$—$B_2O_3$-based glass powder, and 11% by mass of organic vehicle (organic binder: 2.5% by mass of acrylic resin, organic solvent: 8.5% by mass of α-terpineol, proportion of α-terpineol to acrylic resin: 3.4). Thus first metal pastes and second metal pastes were prepared. The metal pastes each had a viscosity in the range of 0.8 Pa·s to 1.3 Pa·s.

Subsequently, the first metal paste and the second metal paste were introduced around the inner wall of the through hole 12 and the center of the diameter of the through hole 12, respectively, using a nozzle that can simultaneously discharge the two metal pastes. Subsequently, screen printing was performed to form a metal wiring layer 14 covering and in contact with the surface of the through conductor 13 at one main surface of the ceramic sintered body 11, using the same metal paste as the second metal paste of Sample No. 2. The metal wiring layer 14 was formed to a thickness of 40 μm. After being dried at 100° C. in an atmosphere of ambient air, the resulting structure was fired at 900° C. in a nitrogen atmosphere containing 5 ppm of oxygen for one hour to complete the through conductor 13 and the metal wiring layer 14, and thus samples of Nos. 1 to 18 were obtained.

Subsequently, some of the test pieces of each sample No. were cut, and each section was polished with a cross-section polisher (CP) so as to be coincide with the section cut through the diameter of the through hole 12 in the ceramic sintered body 11. Then, the resulting section of the through conductor 13 was etched with a known etchant. Then, five points arbitrarily selected in each of the first portion 13a and the second portion 13b were observed through an SEM (scanning electron microscope) at a magnification of 5000 times, and crystal grain sizes were measured from each observation image with image analysis software. Thus, average crystal grain sizes were calculated from the measured values of the crystal grain sizes. Also, the ratio of the average crystal grain size to the smallest diameter, 130 μm, of the through hole 12 was calculated. In addition, for the observed images, the area percentage in the second portion 13b of the grains having crystal grain sizes of 4% to 10% of the smallest diameter of the through hole 12 was calculated using image analysis software.

Subsequently, the portion of the surface of the metal wiring layer 14 not covering the through conductor 13 and the portion of the surface of the metal wiring layer 14 covering the through conductor 13 were measured at several points with a laser displacement gauge, and the difference between the largest value and smallest value of the measurements was defined as the value of the depression.

Subsequently, for examining the ability of heat radiation, an electronic component 15 was mounted on each sample, and a current of 30 A was applied to the electronic component. The surface temperature of the electronic component 15 was measured with a thermography (manufactured by JEOL Co., Ltd., model: JTG-7200) 5 minutes after the application of the current. The measuring distance was 20 cm.

Subsequently, each sample was subjected to heat cycles, each in which the environmental temperature was reduced to −45° C. from room temperature and kept for 15 minutes, then increased to 125° C. and kept for 15 minutes and further reduced to room temperature, using a heat shock tester. For each sample NO., 20 test pieces were subjected to 2000 to 3000 cycles. The test pieces were taken out one by one every 50 cycles, and the interface between the inner wall of the through hole 12 and the through conductor 13 was observed. The number of cycles when separation was observed is shown in Table 1. The separation was checked by observation through an SEM at a magnification of 1000 times. The results of the above-described calculations and measurements are shown in Table 1.

than or equal to the average crystal grain size in the second portion 13b, had depressions of 14.7 μm or more and surface temperatures of 78.2° C. or more, and exhibited a number of cycles of 2050 or less.

On the other hand, Sample Nos. 1 to 16, in which the average crystal grain size in the second portion 13b was larger than the average crystal grain size in the first portion 13a, had depressions of 12 μm or less and surface temperatures of 72° C. or less, and exhibited a number of cycles of 2200 or more, thus showing that they were reliable circuit boards exhibiting good heat radiation.

Also, Sample Nos. 6 to 16, in which the second portion 13b contained 50% by area or more of grains having crystal grain sizes of 4% to 10% of the smallest diameter of the through hole 12, had depressions of 9.2 μm or less and surface temperatures of 67.4° C. or less, and exhibited a number of cycles of 2500 or more, thus showing that they were better circuit boards.

Furthermore, Sample Nos. 12 to 15, in which the average crystal grain size in the first portion 13a was in the range of 1.5% to less than 4% of the smallest diameter of the through hole 12, had depressions of 8.4 μm or less and surface temperatures of 64.4° C. or less, and exhibited a number of cycles of 2750 or more, thus showing that they were still better circuit boards.

EXAMPLE 2

Samples each in which the average crystal grain sizes of the second portion 13b of the through conductor 13 and the metal wiring layer 14 were varied among samples were prepared, and were examined for heat radiation and reliability. For preparing the samples, a wiring layer 14 was formed on the through conductor 13 having the same composition as Sample No. 14 in Example 1, using the same metal paste as the metal paste used for forming the second portion 13b of any one of Samples Nos. 4, 8 and 14 in Example 1. The metal wiring layer 14 of Sample No. 19 had the same composition as the second portion 13b of Sample No. 4 in

TABLE 1

| Sample No. | First portion Average crystal grain size | | Second portion Average crystal grain size | | Area percentage | Depression | Surface temperature | Cycle |
|---|---|---|---|---|---|---|---|---|
| | μm | % | μm | % | % by area | μm | ° C. | Number of times |
| 1 | 1.3 | 1.0 | 3.8 | 2.9 | 28 | 12.0 | 72.0 | 2200 |
| 2 | 1.3 | 1.0 | 4.0 | 3.1 | 30 | 11.5 | 70.8 | 2300 |
| 3 | 1.3 | 1.0 | 4.3 | 3.3 | 35 | 10.9 | 70.2 | 2350 |
| 4 | 1.3 | 1.0 | 4.6 | 3.5 | 40 | 10.3 | 70.0 | 2400 |
| 5 | 1.3 | 1.0 | 4.8 | 3.7 | 45 | 9.7 | 69.2 | 2400 |
| 6 | 1.4 | 1.1 | 5.2 | 4.0 | 50 | 9.2 | 67.4 | 2500 |
| 7 | 1.4 | 1.1 | 5.5 | 4.2 | 58 | 8.8 | 66.4 | 2600 |
| 8 | 1.4 | 1.1 | 7.0 | 5.4 | 75 | 8.5 | 65.7 | 2650 |
| 9 | 1.4 | 1.1 | 7.5 | 5.8 | 90 | 8.4 | 65.1 | 2600 |
| 10 | 1.4 | 1.1 | 8.0 | 6.2 | 95 | 8.2 | 65.7 | 2550 |
| 11 | 1.5 | 1.2 | 5.6 | 4.3 | 64 | 8.5 | 65.8 | 2650 |
| 12 | 1.9 | 1.5 | 5.6 | 4.3 | 64 | 8.4 | 64.4 | 2750 |
| 13 | 3.1 | 2.4 | 5.7 | 4.4 | 65 | 8.4 | 64.1 | 2850 |
| 14 | 4.3 | 3.3 | 5.9 | 4.5 | 66 | 8.4 | 63.6 | 2950 |
| 15 | 5.1 | 3.9 | 6.0 | 4.6 | 67 | 8.3 | 63.3 | 2800 |
| 16 | 5.2 | 4.0 | 6.1 | 4.7 | 67 | 8.3 | 63.1 | 2700 |
| 17 | 2.5 | 1.9 | 2.1 | 1.6 | 20 | 15.5 | 80.2 | 2000 |
| 18 | 3.1 | 2.4 | 3.1 | 2.4 | 24 | 14.7 | 78.2 | 2050 |

Table 1 shows that Sample Nos. 17 and 18, in which the average crystal grain size in the first portion 13a was larger Example 1. Similarly, Sample No. 20 corresponds to Sample NO. 14 in Example 1, and Sample No. 21 corresponds to Sample No. 8 in Example 1. Example 2 was thus performed in the same manner as Example 1 except that the metal paste was varied.

Then, heat radiation test and heat cycle test were performed in the same manner as in Example 1. The results are shown in Table 2.

TABLE 2

| Sample No. | Second portion average crystal grain size μm | Metal wiring layer average crystal grain size μm | Surface temperature ° C. | Cycle Number of times |
|---|---|---|---|---|
| 19 | 5.9 | 3.8 | 63.0 | 3000 |
| 20 | 5.9 | 5.9 | 63.9 | 2800 |
| 21 | 5.9 | 7.0 | 64.7 | 2700 |

Table 2 shows that Sample No. 19 exhibited a larger number of cycles than Sample Nos. 20 and 21. This suggests that heat generated by the operation of the electronic component 15 can be allowed to flow smoothly from the metal wiring layer 14 to the second portion 13b of the through conductor 13 and thus heat radiation can be increased, by controlling the average crystal grain size in the second portion 13b so as to be higher than the average crystal grain size in the metal wiring layer 14.

EXAMPLE 3

Samples each in which the glass contents in the first portion 13a and second portion 13b were varied among samples were prepared, and were examined for heat radiation and reliability. For preparing the samples, the glass content in the second metal paste was varied to 2.0% by mass for Sample No. 22, to 3.0% by mass for Sample No. 23, and to 4.0% by mass for Sample No. 24. In the samples, the amount of the organic vehicle was reduced or increased by the amount of the glass powder increased or reduced while the proportion of terpineol to acrylic resin was fixed to 3.4. Example 3 was thus performed in the same manner as Examples 1 and 2 except that the second metal paste was varied.

Then, heat radiation test and heat cycle test were performed in the same manner as in Example 1. For measuring the glass contents in the first portion 13a and the second portion 13b, first, the through conductor 13 was cut in the thickness direction of the ceramic sintered body 11, and the section polished with a cross-section polisher (CP) was measured. Subsequently, the first portion 13a and the second portion 13b were viewed with an EDS attached to an SEM at a magnification of 2000 times, and five arbitrarily selected points were observed. Each observation image was analyzed for the glass content using image analysis software, and thus calculated average values were defined as the glass contents of the first portion 13a and the second portion 13b. The results are shown in Table 3.

TABLE 3

| Sample No. | Glass content in first portion % by area | Glass content in second portion % by area | Surface temperature ° C. | Cycle Number of times |
|---|---|---|---|---|
| 22 | 7.4 | 4.9 | 63.0 | 2800 |
| 23 | 8.0 | 8.0 | 63.6 | 2950 |
| 24 | 7.8 | 10.3 | 63.9 | 3100 |

Table 3 shows that Sample No. 24 exhibited a larger number of cycles than Sample Nos. 22 and 23. This suggests that the thermal expansion of the second portion 13b, which occupies a larger volume of the through conductor 13, was reduced by controlling the glass content in the second portion 13b to be higher than the glass content in the first portion 13a. Thus, it has been found that the form change of the through conductor 13 caused by heat cycles in which the electronic component 15 is repeatedly started and stopped can be reduced, and that thus the through conductor 13 is unlikely to separate easily from the through hole 12.

EXAMPLE 4

A sample prepared using a metal paste containing Bi-containing glass (hereinafter referred to as Bi-containing sample) and a sample prepared using a metal paste containing Bi-free glass (hereinafter referred to as Bi-free sample) were subjected to heat cycle test. The preparation of the samples and the test were performed in the same manner as in Example 1 except that $R_2O$—$SiO_2$—$B_2O_3$-base or $R_2O$—$SiO_2$—$B_2O_3$—$Bi_2O_3$-based glass powder was used. The interface between the inner wall of the through hole 12 and the through conductor 13 was observed by TEM, and the presence of Bi was confirmed in the sample prepared using the metal paste containing Bi-containing glass.

The results of the heat cycle test showed that the number of cycles of the Bi-containing sample was 10% larger than that of the Bi-free sample. Thus, it was found that the bonding strength between the inner wall of the through hole 12 and the through conductor 13 can be enhanced by adding Bi to the glass, so that such a reliable circuit board can be achieved that the through conductor 13 is unlikely to be much separated even by repeatedly applied heat.

EXAMPLE 5

Samples were prepared in which the diameters of the through hole 12 at the main surface of the ceramic sintered body 11 were varied, and were subjected to tests for heat radiation and reliability. The samples were prepared in the same manner as in Example 1 except that the diameters of the through hole 12 at one main surface of the ceramic sintered body 11 and at the other main surface were varied as shown in Table 4 by controlling the oscillation power of laser processing. The compositions of the metal pastes for the through conductor 13 and the metal wiring layer 14 were the same as those of Sample No. 14 in Example 1.

Then, heat radiation test and heat cycle test were performed in the same manner as in Example 1. The results are shown in Table 4.

TABLE 4

| | Ceramic sintered body | | | |
|---|---|---|---|---|
| Sample No. | Through hole diameter at one surface μm | Through hole diameter at the other surface μm | Surface temperature ° C. | Cycle Number of times |
| 25 | 130 | 130 | 63.6 | 2950 |
| 26 | 130 | 140 | 62.6 | 3000 |
| 27 | 130 | 150 | 59.4 | 3250 |

Table 4 shows that Sample Nos. 26 and 27, in which the through holes 12 had larger open areas at one of the main surfaces of the ceramic sintered body 11 than those at the other in comparison with the through hole 12 of Sample No. 25, were circuit boards exhibiting better heat radiation and higher reliability.

REFERENCE SIGNS LIST

1: electronic device
10: circuit board
11: ceramic sintered body
12: through hole
13: through conductor
13a: first portion
13b: second portion
14: metal wiring layer
15: electronic component
16: electrode pad

The invention claimed is:

1. A circuit board comprising:
a ceramic sintered body having a plate shape with first and second main surfaces, and comprising a through hole penetrating from the first main surface to the second main surface;
a through conductor in the through hole, comprising a metal and having a first end at the first main surface and a second end at the second main surface; and
a metal wiring layer covering the first end and electrically connected to the through conductor,
wherein the through conductor comprises:
a first portion that has a hollow cylinder shape is in contact with an inner wall of the through hole, and extends from the first end to the second end; and
a second portion that has a columnar shape, is located inside the first portion, and is in contact with an inner wall of the hollow cylinder;
wherein the second portion has a second average crystal grain size of the metal that exceeds a first average crystal grain size of the metal of the first portion; and
wherein the through conductor contains glass, and the second portion has a glass content higher than a glass content in the first portion.

2. The circuit board according to claim 1, wherein metal grains of the metal that has crystal grain sizes 4% or more and 10% or less of the smallest diameter of the through hole occupy 50% by area or more of the second portion.

3. The circuit board according to claim 1, wherein the first average crystal grain size is in a range of 1.5% to 4% of the smallest diameter of the through hole.

4. The circuit board according to claim 1, wherein the second average crystal grain size is larger than an average crystal grain size of metal grains in the metal wiring layer.

5. The circuit board according to claim 1, wherein the glass contains Bi.

6. The circuit board according to claim 1, wherein the through hole comprises a first opening at the first main surface with a first area and a second opening at the second main surface with a second area, the first area being larger than the second area.

7. An electronic device, comprising:
the circuit board according to claim 1; and
an electronic component on the metal wiring layer of the circuit board.

8. A circuit board comprising:
a ceramic sintered body having a plate shape with first and second main surfaces, and comprising a through hole penetrating from the first main surface to the second main surface;
a through conductor in the through hole, comprising a metal and having a first end at the first main surface and a second end at the second main surface; and
a metal wiring layer covering the first end and electrically connected to the through conductor,
wherein the through conductor comprises:
a first portion that has a hollow cylinder shape is in contact with an inner wall of the through hole, and extends from the first end to the second end; and
a second portion that has a columnar shape, is located inside the first portion, and extends from the first end to the second end,
wherein the second portion has a second average crystal grain size of the metal that exceeds a first average crystal grain size of the metal of the first portion; and
wherein the through conductor contains glass, and the second portion has a glass content higher than a glass content in the first portion.

9. The circuit board according to claim 8, wherein metal grains of the metal that has crystal grain sizes 4% or more and 10% or less of the smallest diameter of the through hole occupy 50% by area or more of the second portion.

10. The circuit board according to claim 8, wherein the first average crystal grain size is in a range of 1.5% to 4% of the smallest diameter of the through hole.

11. The circuit board according to claim 8, wherein the second average crystal grain size is larger than an average crystal grain size of metal grains in the metal wiring layer.

12. The circuit board according to claim 8, wherein the glass contains Bi.

13. The circuit board according to claim 8, wherein the through hole comprises a first opening at the first main surface with a first area and a second opening at the second main surface with a second area, the first area being larger than the second area.

14. An electronic device, comprising:
the circuit board according to claim 8; and
an electronic component on the metal wiring layer of the circuit board.

15. The circuit board according to claim 1,
wherein the first portion extends from the first end and terminates at the second end; and
wherein the second portion extends from the first end and terminates at the second end.

16. The circuit board according to claim 8,
wherein the first portion extends from the first end and terminates at the second end; and
wherein the second portion extends from the first end and terminates at the second end.

17. The circuit board according to claim 1, wherein the through conductor contains more than 50% by mass of copper, silver, or aluminum.

18. The circuit board according to claim 8, wherein the through conductor contains more than 50% by mass of copper, silver, or aluminum.

* * * * *